(12) United States Patent
Cheng et al.

(10) Patent No.: US 8,025,264 B2
(45) Date of Patent: Sep. 27, 2011

(54) DISPLAY SUPPORT DEVICE

(75) Inventors: Sheng Hsiung Cheng, Taipei (TW); Te An Lin, Taipei (TW); Shuang Ji Jiang, Taipei (TW)

(73) Assignee: Aopen Incorporated, Taipei (TW)

( * ) Notice: Subject to any disclaimer, the term of this patent is extended or adjusted under 35 U.S.C. 154(b) by 280 days.

(21) Appl. No.: 12/504,802

(22) Filed: Jul. 17, 2009

(65) Prior Publication Data

US 2011/0011997 A1 Jan. 20, 2011

(51) Int. Cl.
*A47B 96/00* (2006.01)
(52) U.S. Cl. ............... 248/222.13; 248/201; 248/918
(58) Field of Classification Search ............. 248/201, 248/214, 222.11, 222.13, 291.1, 292.11, 248/918, 922, 923; D8/373, 380
See application file for complete search history.

(56) References Cited

U.S. PATENT DOCUMENTS

| 7,316,379 | B1 * | 1/2008 | Graham | 248/298.1 |
| 7,441,739 | B2 * | 10/2008 | Huang | 248/292.14 |
| 7,637,465 | B2 * | 12/2009 | Huang | 248/222.13 |
| 7,806,279 | B2 * | 10/2010 | Kubota | 211/94.01 |
| 7,878,473 | B1 * | 2/2011 | Oh | 248/339 |

\* cited by examiner

*Primary Examiner* — Gwendolyn Baxter
(74) *Attorney, Agent, or Firm* — Bacon & Thomas, PLLC

(57) ABSTRACT

A display support device is provided, which is disposed at a rear surface of a display, such that the display is able to be suspended on a main support bracket arranged at a wall. The support bracket disclosed in the present invention is provided with one more hooks, for connecting the support bracket to the support bracket body. Furthermore, a positioning bar having a fastening function is pivoted on the support bracket body, so as to fasten the support bracket to a contact surface of the main support bracket by means of the positioning bar after being connected to the main support bracket, such that the main support bracket can be more firmly positioned, thus preventing the support bracket from releasing from the main support bracket due to vibration, and improving the fastness and safety in use.

8 Claims, 8 Drawing Sheets

DISPLAY SUPPORT DEVICE

BACKGROUND OF THE INVENTION

1. Field of the Invention

The present invention relates to a display support device, which is disposed at a rear surface of a display, such that the display is able to be suspended on a main support bracket by the support bracket, and more particularly, to a display support device capable of achieving more efficient firmness of a display after being suspended by means of fasten.

2. Related Art

Referring to FIG. 1, a schematic view of suspending a display in the prior art is shown. As shown in FIG. 1, a support bracket 101 is disposed at a rear surface of a display 10, and an upper hook 1011 and a lower hook 1012 are formed on ends of the support bracket 101. Moreover, a main support bracket 11 is formed with an upper hook edge 111 and a lower hook edge 112, and can be arranged at a wall 12 in advance. The display 10, when intended to be mounted on the main support bracket 11, is hooked on the upper hook edge 111 and the lower hook edge 112 of the main support bracket 11 by its upper hook 1011 and lower hook 1012 respectively, such that the display 10 is secured on the main support bracket 11 by utilizing the engagement of the hooks and hook edges, and the purpose of effective fixation is achieved. Referring back to FIG. 1, as shown in the figure, the display 10 can be secured by the conventional fixation manner, however, it can be seen from the figure that the display 10 is fixed merely by hooking each of the hooks (1011, 1012) to each of the hook edges (111, 112), and in the case of vibration, for example, earthquake, the release of each of the hooks (1011, 1012) from each of the hook edges (111, 112) can occur. Because in this type of fixation manner, the display 10 is generally suspended on the wall 12 at a certain height, and might release from the main support bracket 11 in the case of earthquake above to fall onto the ground directly, which can lead to the damage of the display 10, and even hurt the persons nearby. Therefore, this type of fixation manner has certain risks in practical application.

SUMMARY OF THE INVENTION

The present invention is directed to a display support device capable of effectively fixing a display after being suspended, thereby improving the safety in use.

As embodied and broadly described herein, the present invention mainly includes mounting a positioning bar on a support bracket body. By the fastening effect generated through the movement of the positioning bar, after a display is suspended at a main support bracket, an effective fixation state can be further formed between the main support bracket and the support bracket body by fastening the main support bracket with the positioning bar, thereby improving the firmness of the display after being suspended.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
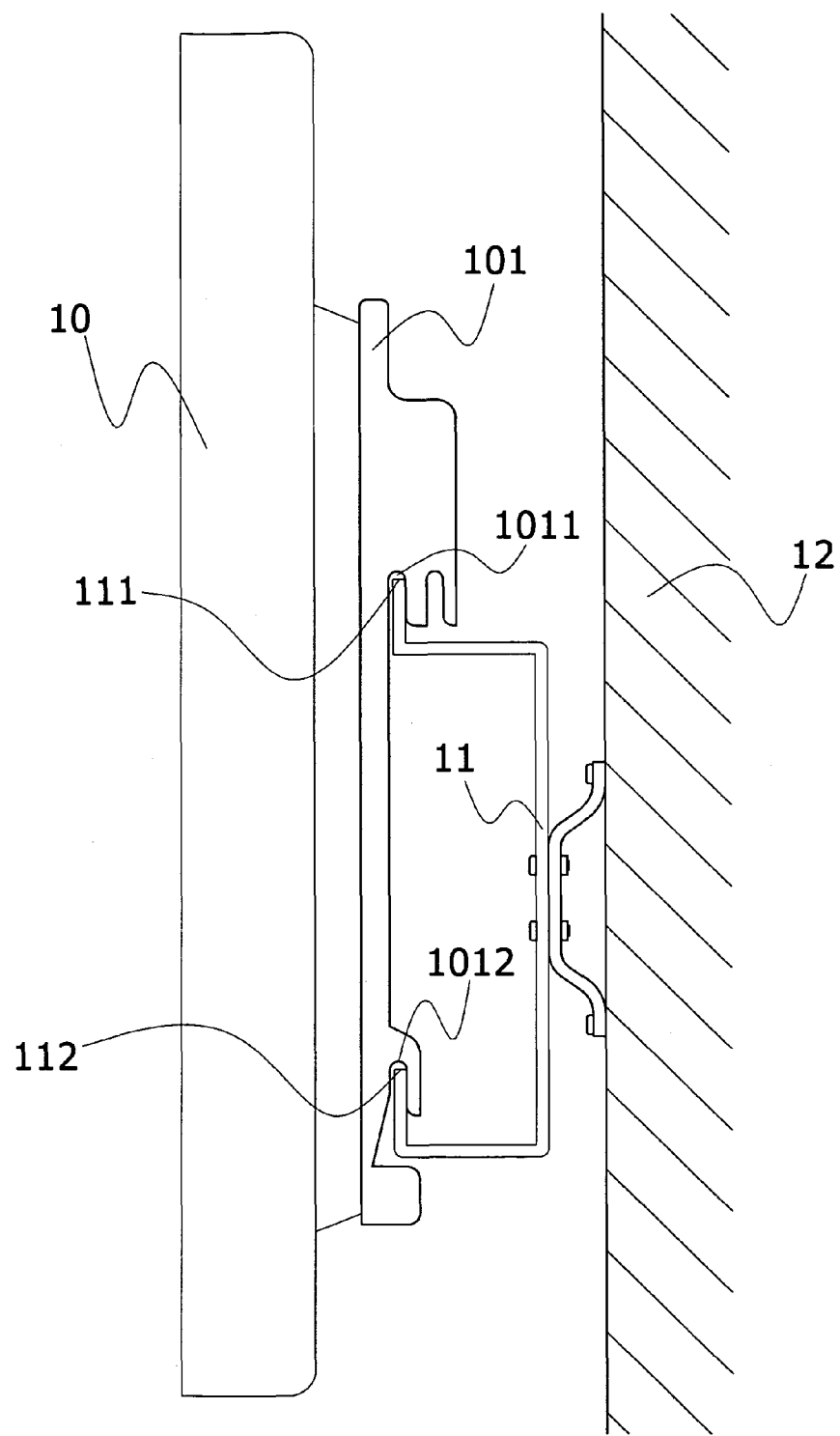
FIG. 1 shows a schematic view of suspending a display in the prior art.
Figure 2:
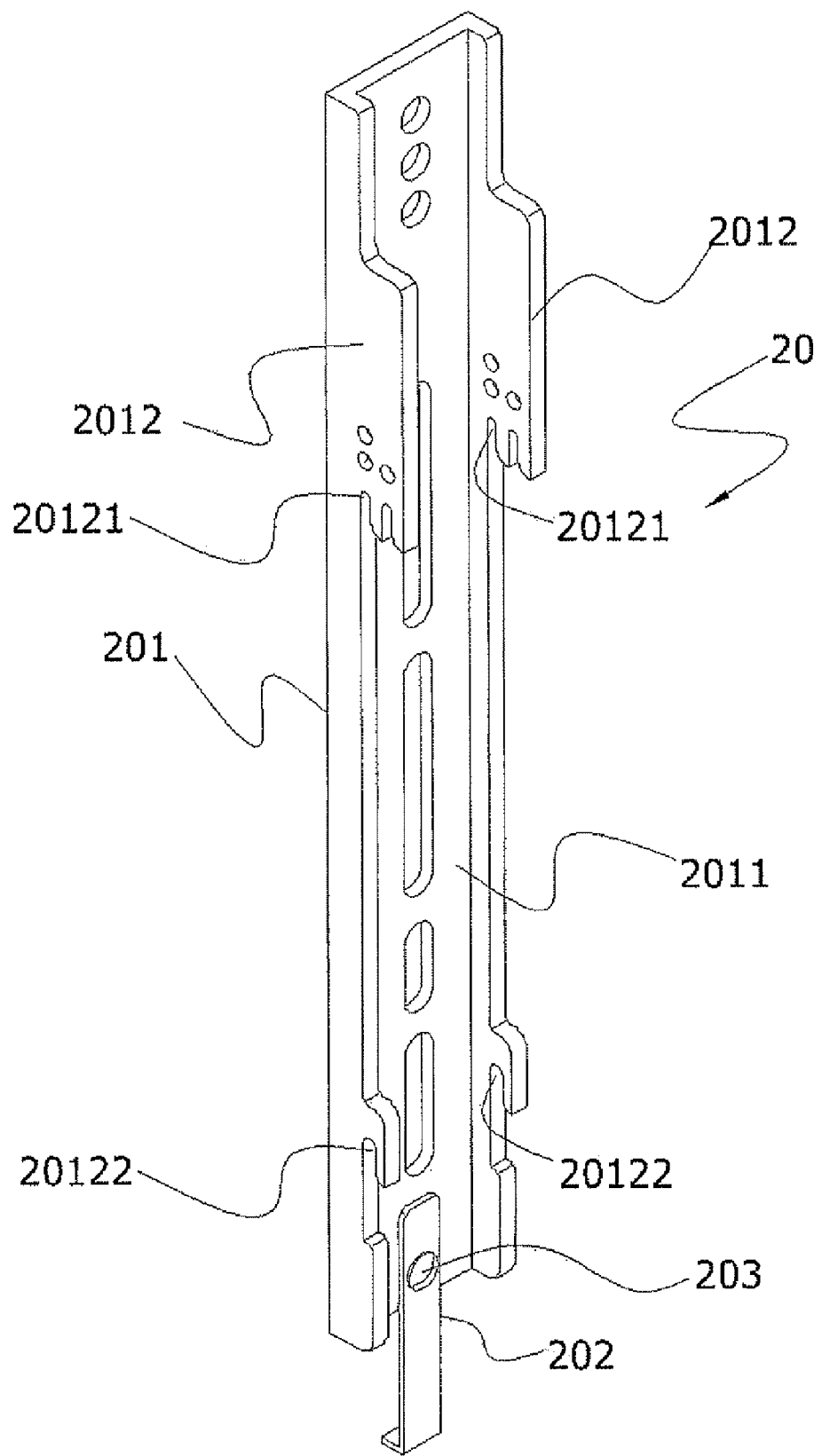
FIG. 2 shows a three-dimensional view of an appearance of the present invention.

Referring to FIG. 2, a three-dimensional view of an appearance of the present invention is shown. As shown in FIG. 2, a display support device 20 of the present invention includes a support bracket 201 and a positioning bar 202. The support bracket 201 is formed with a mounting plane 2011, a wing part 2012 is formed at two edges of the mounting plane 2011 respectively, and each of the two wing parts 2012 is formed with an upper hook 20121 and a lower hook 20122. A pivotal element 203 passes through the positioning bar 202, so as to pivot the positioning bar 202 to the mounting plane 2011 of the support bracket 201. The positioning bar 202 is capable of generating deflection movement relative to the mounting plane 2011 with the pivotal element 203 as a center.

Figure 3:
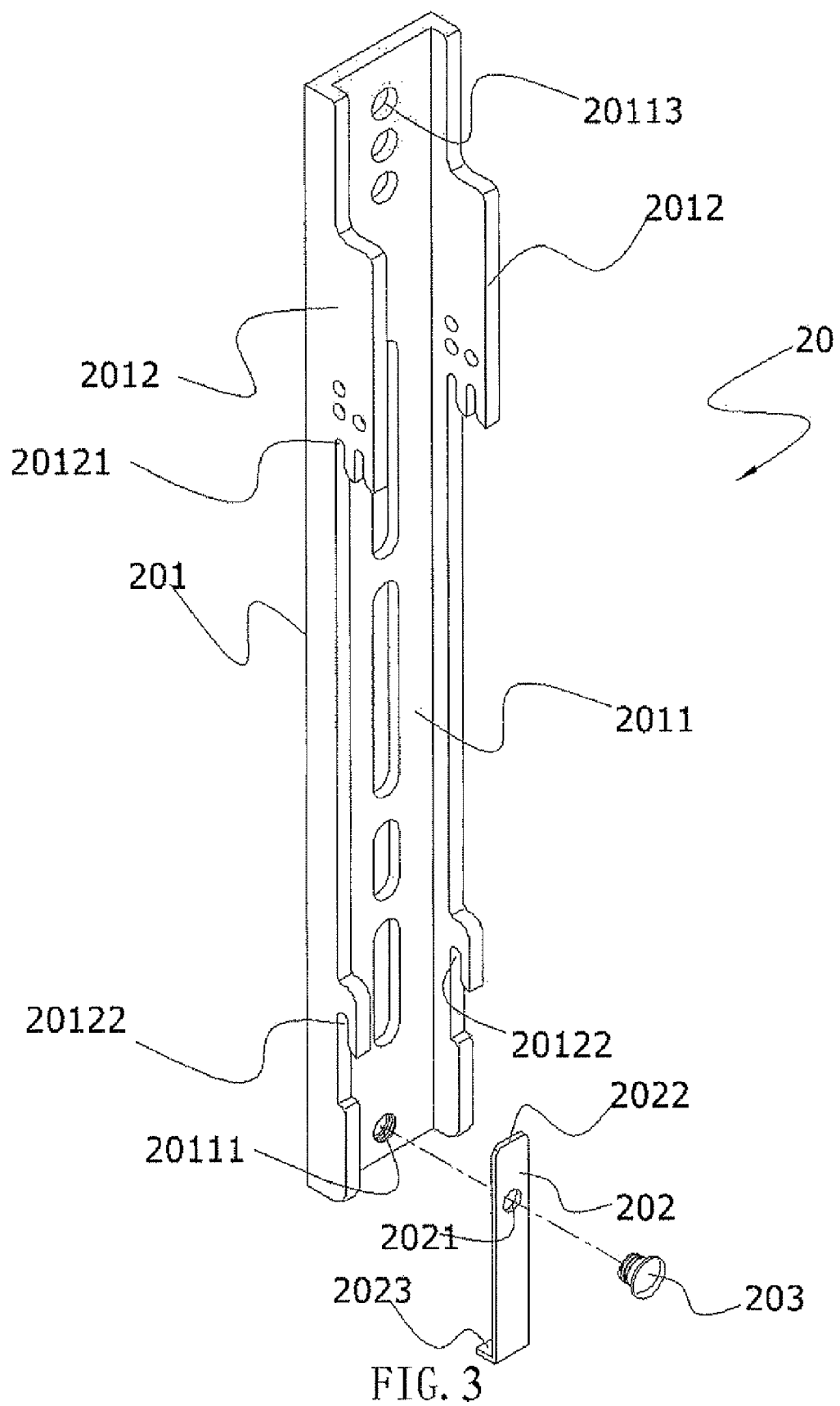
FIG. 3 shows a schematic structural view of members of the present invention.

Referring to FIG. 3, a schematic structural view of members of the present invention is shown. As shown in FIG. 3, the mounting plane 2011 of the support bracket 201 has at least one through hole 20113. One or more screws (not shown) passes through the through hole 20113, such that the support bracket 201 is fixed to a rear surface of a display (not shown). Also, a pivotal part 20111 is formed on the plane near the lower edge of the mounting plane 2011. Referring back to FIG. 3, a through hole 2021 is formed on a plane of the positioning bar 202, one end of the positioning bar 202 is formed with a fastening part 2022, and the other end thereof is formed as a swing part 2023. During the mounting, the pivotal element 203 (the pivotal element 203 described in this embodiment is a screw) passes through the through hole 2021 of the positioning bar 202, and then fixed at the pivotal part 20111 of the support bracket 201. After finishing the mounting, the positioning bar 202 may deflect with the pivotal element 203 as a center.

Figure 4:
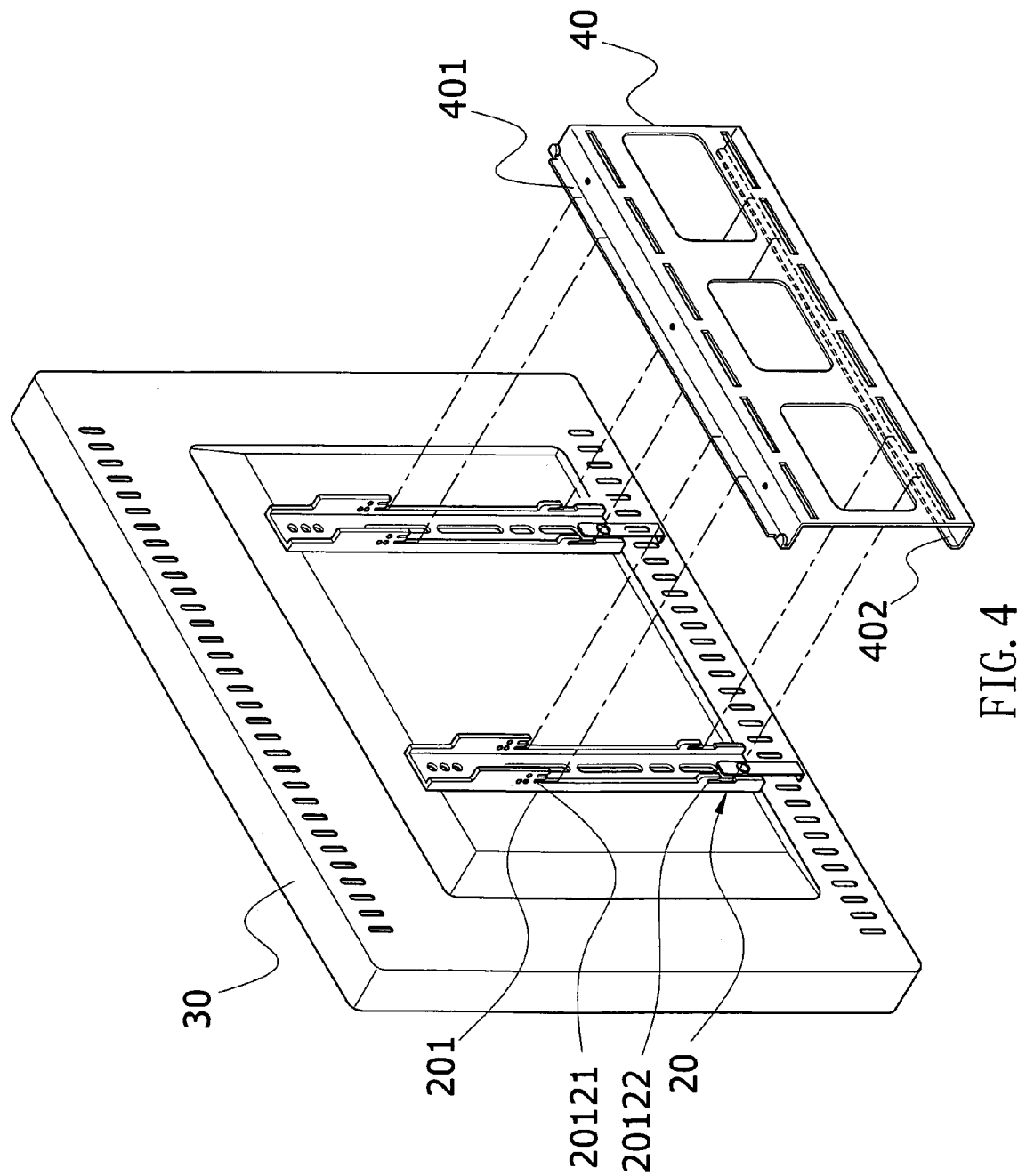
FIG. 4 shows a first schematic view of an embodiment according to the present invention.

Referring to FIG. 4, a first schematic view of an embodiment according to the present invention is shown. As shown in FIG. 4, when being used, the display support device 20 of the present invention is mounted at the rear surface of a display 30. After finishing the mounting, the upper hook 20121 and the lower hook 20122 of the support bracket 201 respectively hook the upper hook edge 401 and the lower hook edge 402 of a main support bracket 40, such that the display 30 is fixed to the main support bracket 40 by the hook effect between the hooks (20121, 20122) and the hook edges (401, 402).

Figure 5:
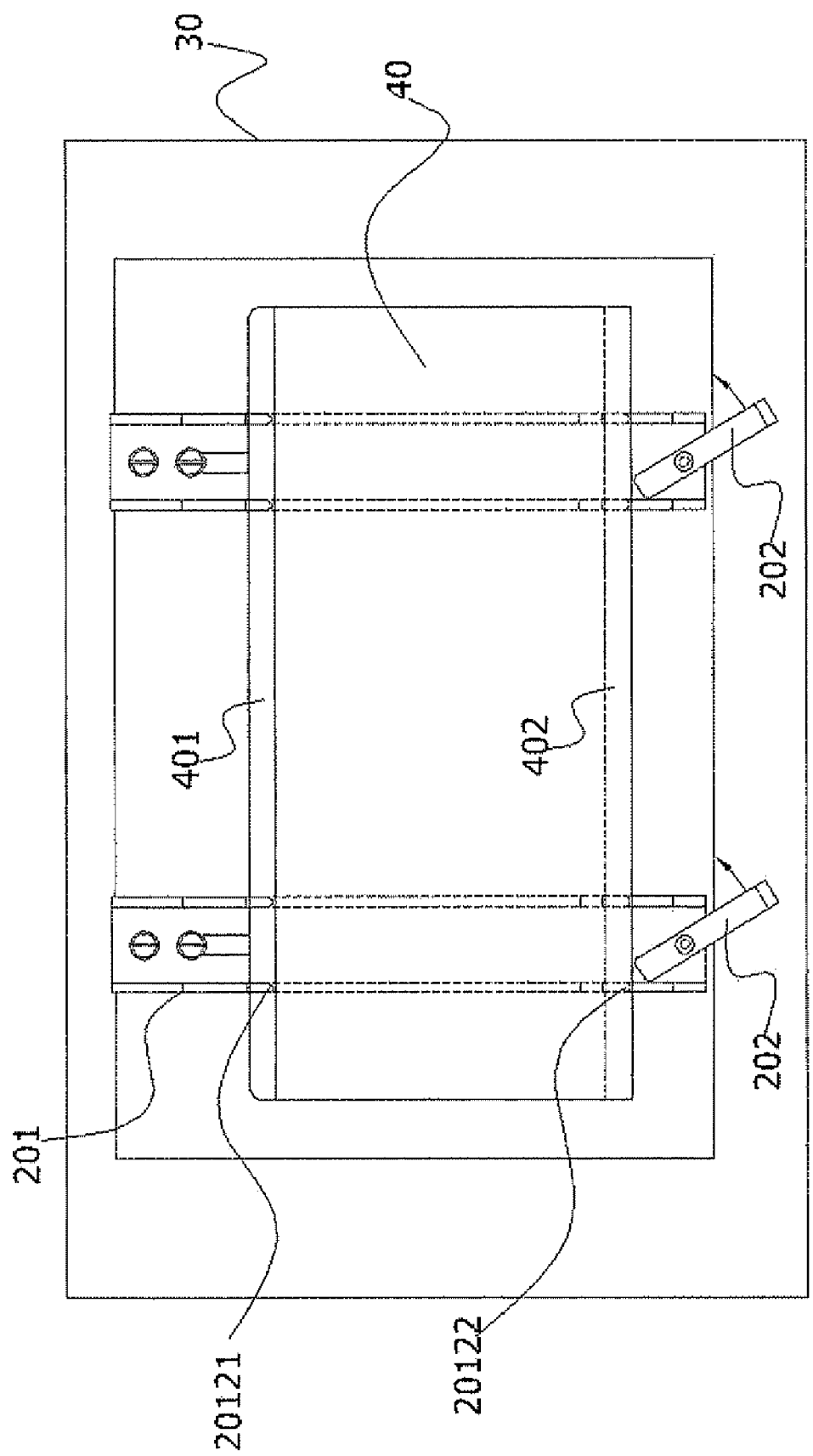
FIG. 5 shows a second schematic view of an embodiment according to the present invention.

Referring to FIG. 5, a second schematic view of an embodiment according to the present invention is shown. As shown in FIG. 5, when hooking of the hooks (20121, 20122) of the support bracket 201 to the hook edges (401, 402), the positioning bar 202 can be deflected to a suitable position first, such that the hooks (20121, 20122) can be successfully hooked to the hook edges (401, 402). As shown, especially for the lower hook 20122, if the positioning bar 202 is not in a deflection state, the lower hook 20122 might not be hooked to the lower hook edge 402 successfully due to interference; and when the positioning bar 202 is deflected to a suitable position, the lower hook 20122 can be successfully hooked to the lower hook edge 402.

Figure 6:
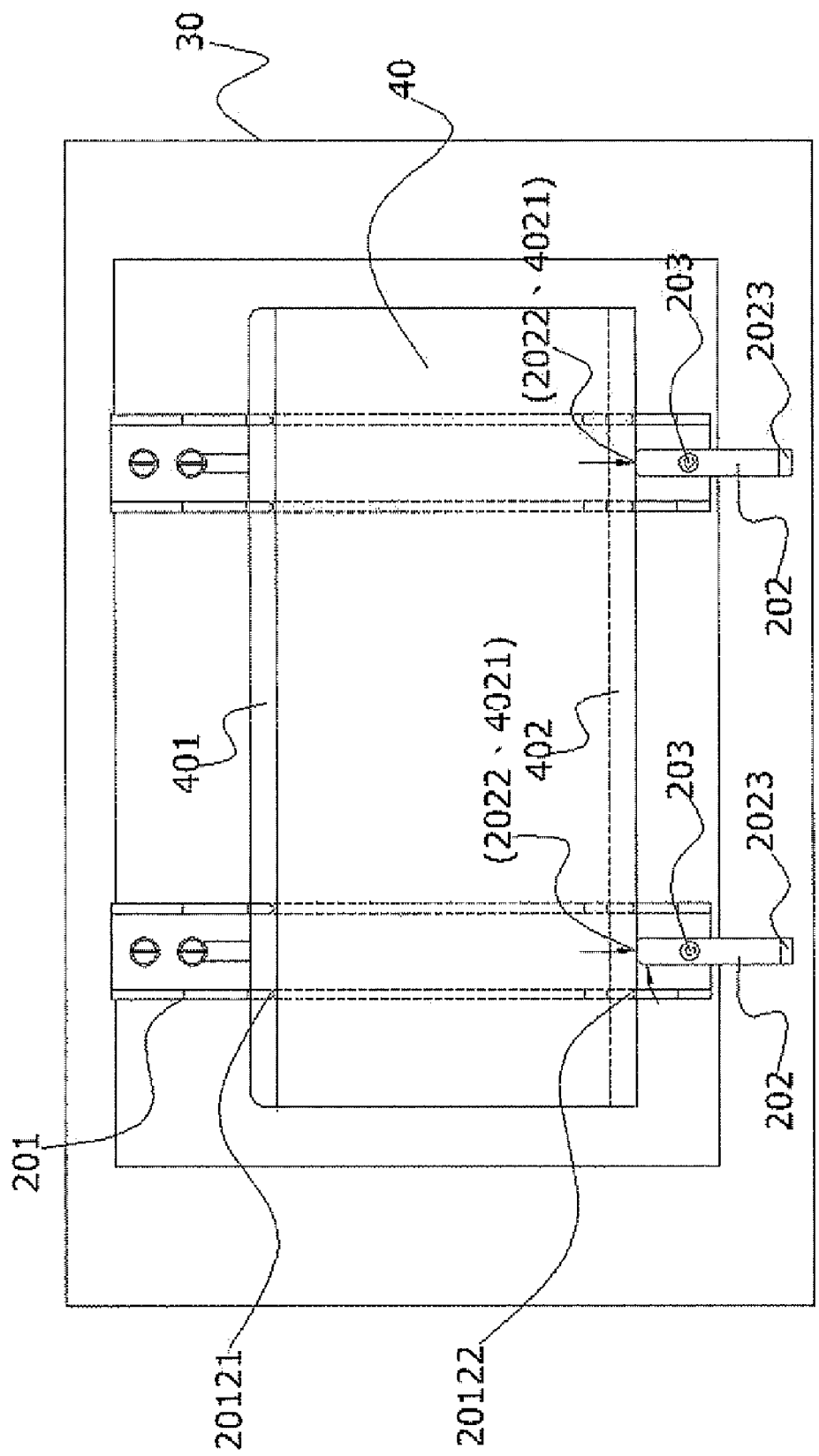
FIG. 6 shows a third schematic view of an embodiment according to the present invention.

Referring to FIG. 6, a third schematic view of an embodiment according to the present invention is shown. When each of the hooks (20121, 20122) is hooked to each of the corresponding hook edges (401, 402), the operator applies a force on the positioning bar 202 to swing the swing part 2023, such that the positioning bar 202 is deflected back to the original position with the pivotal element 203 as a center, and thus the fastening part 2022 at the upper edge of the positioning bar 202 tightly leans against a lower plane 4021 of the main support bracket 40. In this way, the lower plane of the main support bracket 40 is limited between the positioning bar 202 and the lower hook 20122. That is to say, with this fastening effect, the lower hook 20122 of the support bracket 201 will not release from the lower hook edge 402 of the main support bracket 40 even in the case of vibration, thereby improving the firmness of the whole device after mounting.

Figure 7:
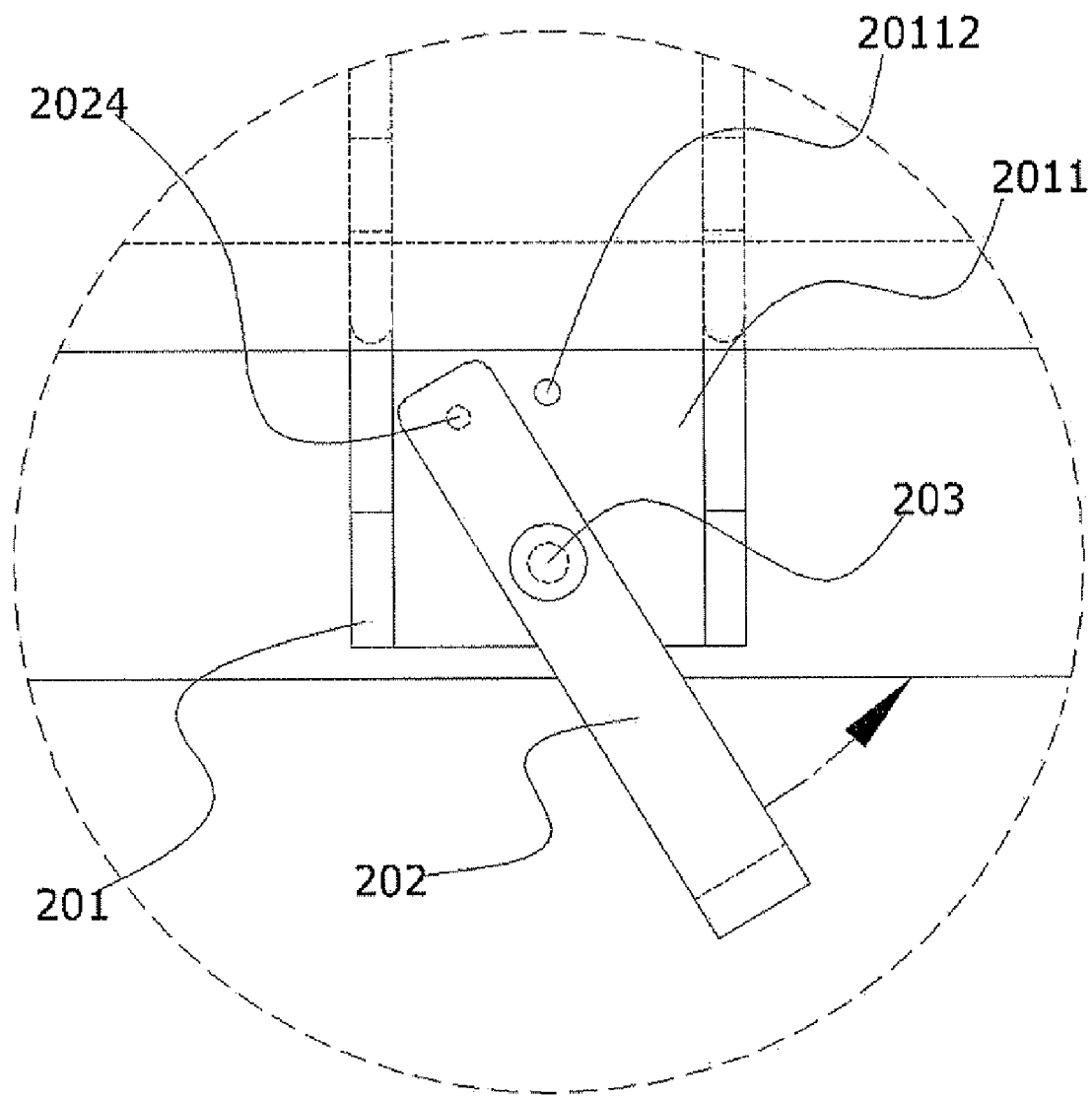
FIG. 7 shows an another preferable embodiment of the present invention.
Figure 8:
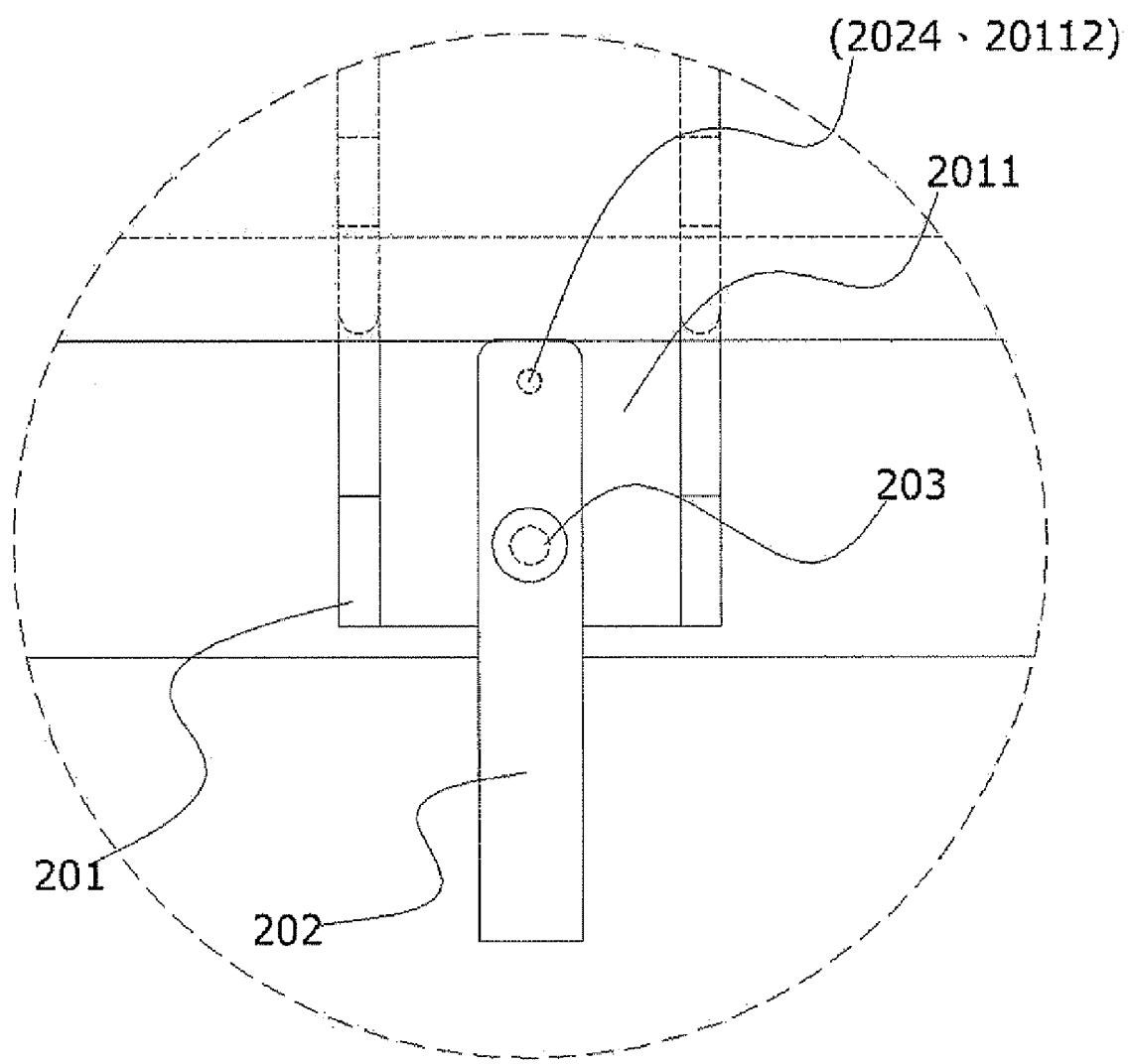
FIG. 8 shows a still another preferable embodiment of the present invention.

Referring to FIG. 7, another preferable embodiment of the present invention is shown. As shown in FIG. 7, the positioning bar 202 of the present invention can be further formed with a positioning point 2024 on the plane facing the support bracket 201, and a relative positioning point 20112 can also be formed on the plane of mounting plane 2011 of the support bracket 201 at a corresponding position. Referring to FIG. 8, a still another preferable embodiment of the present invention is shown. As shown, when the positioning bar 202 is deflected back to its original position, the positioning point 2024 is just fitted in the relative positioning point 20112 on the plane of mounting plane 2011, so as to improve the firmness of the positioning bar 202 in fasten state. Furthermore, one of the positioning point 2024 and the relative positioning point 20112 described in the figure can be formed as a boss, and the other one is formed as a through hole or a recess, such that a mutual limitation effect can be achieved when the two points are overlapped.

As described above, the present invention mainly includes further mounting a positioning bar capable of producing a fastening effect on the mounting plane of the support bracket body, so that the lower hook edge of the main support bracket is limited by the lower hook of the support bracket and the positioning bar through the fastening effect produced by the positioning bar after the support bracket is hooked on the main support bracket, thereby effectively ensuring that the lower hook will not release from the lower hook edge, and significantly improving the firmness thereof. Furthermore, the simple overall structure and easy operation also lead to the simplified operation process and achieve the requirement of easy operation. Therefore, the present invention can certainly achieve the purpose of providing a display support device through which a display is effectively fixed after being suspended, thus improving the safety in use, according to the embodiments of the present invention.

However, it is understood that the descriptions above are only the preferable embodiments of the present invention, and not intended to limit the scope of the present invention. All equivalent modifications and changes made by those skilled in the art without departing from the spirit and scope of the present invention shall fall into the claims of the present invention.

What is claimed is:

1. A display support device, mounted at a rear surface of a display to suspend the display on a main support bracket, comprising:
    a support bracket, formed with a mounting plane, wherein two edges of the mounting plane are formed with a wing part respectively, each of the wing parts has an upper hook and a lower hook, and the mounting plane is formed with a pivotal part;
    a positioning bar, formed with a through hole on a surface thereof, wherein one edge of the positioning bar is formed as a fastening part; and
    a pivotal element, passing through the through hole of the positioning bar, and fixed at the pivotal part of the support bracket, such that the positioning bar deflects with the pivotal element as a center to fasten a plane of the main support bracket.

2. The display support device according to claim 1, wherein the other edge of the positioning bar is formed with a swing part.

3. The display support device according to claim 1, wherein the pivotal element is a screw.

4. The display support device according to claim 1, wherein a positioning point is formed on the plane of the positioning bar facing the mounting plane of the support bracket, and a relative positioning point is also formed on the mounting plane.

5. The display support device according to claim 4, wherein one of the positioning point and the relative positioning point is formed as a boss, and the other one is formed as a through hole.

6. The display support device according to claim 4, wherein one of the positioning point and the relative positioning point is formed as a boss, and the other one is formed as a recess.

7. The display support device according to claim 1, wherein the upper hook and the lower hook of the support bracket are respectively hooked on an upper hook edge and a lower hook edge formed on the main support bracket.

8. The display support device according to claim 7, wherein after the fastening part of the positioning bar tightly leans against the plane of the main support bracket, the lower hook edge is limited between the positioning bar and the lower book of the support bracket.

* * * * *